(12) United States Patent
Lu et al.

(10) Patent No.: US 12,255,136 B2
(45) Date of Patent: Mar. 18, 2025

(54) SEMICONDUCTOR STRUCTURE AND METHOD FOR MANUFACTURING HAVING THE CONDUCTIVE PORTIONS ISOLATED FROM EACH OTHER BY AN INSULATING 2D MATERIAL

(71) Applicant: MACRONIX INTERNATIONAL CO., LTD., Hsinchu (TW)

(72) Inventors: Cheng-Hsien Lu, Taoyuan (TW);
Yun-Yuan Wang, Kaohsiung (TW);
Ming-Hsiu Lee, Hsinchu (TW);
Dai-Ying Lee, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 434 days.

(21) Appl. No.: 17/748,111

(22) Filed: May 19, 2022

(65) Prior Publication Data
US 2023/0378053 A1 Nov. 23, 2023

(51) Int. Cl.
*H01L 23/522* (2006.01)
*H01L 23/532* (2006.01)

(52) U.S. Cl.
CPC .... *H01L 23/5226* (2013.01); *H01L 23/53209* (2013.01); *H01L 23/53276* (2013.01); *H01L 23/5329* (2013.01)

(58) Field of Classification Search
CPC ............. H01L 23/147; H01L 23/481; H01L 23/49827; H01L 23/5226; H01L 23/53209; H01L 23/53276; H01L 23/5329

USPC .................................. 257/774; 438/672, 667
See application file for complete search history.

(56) References Cited

U.S. PATENT DOCUMENTS

| 2014/0145332 | A1 | 5/2014 | Ryan et al. |
| 2018/0158732 | A1* | 6/2018 | Tseng ................. H01L 21/3065 |
| 2018/0269276 | A1 | 9/2018 | Lin et al. |

FOREIGN PATENT DOCUMENTS

TW            201430958 A       8/2014

* cited by examiner

*Primary Examiner* — Hoai V Pham
(74) *Attorney, Agent, or Firm* — McClure, Qualey & Rodack, LLP

(57) ABSTRACT

A semiconductor structure is provided. The semiconductor structure includes a substrate and a via structure. The via structure is through the substrate. The via structure includes a first conductive portion, a second conductive portion, a first barrier portion, a second barrier portion, and a third barrier portion. The first conductive portion has a ring-shaped cross section. The second conductive portion is disposed at an inner side of the first conductive portion. The second conductive portion has a ring-shaped cross section. The first barrier portion is disposed at an outer side of the first conductive portion. The second barrier portion is disposed between the first conductive portion and the second conductive portion. The third barrier portion is disposed at an inner side of the second conductive portion. At least one of the first barrier portion, the second barrier portion, or the third barrier portion includes an insulating 2D material.

20 Claims, 19 Drawing Sheets

SEMICONDUCTOR STRUCTURE AND METHOD FOR MANUFACTURING HAVING THE CONDUCTIVE PORTIONS ISOLATED FROM EACH OTHER BY AN INSULATING 2D MATERIAL

TECHNICAL FIELD

This disclosure relates to a semiconductor structure and a method for manufacturing the same. More particularly, this disclosure relates to a semiconductor structure comprising a via structure and a method for manufacturing the same.

BACKGROUND

In 2.5D and 3D integrations, vias, such as TSV (through silicon via), TGV (through glass via), TPV (through polymer via), TMV (through mold via), TPV (through package via), TIV (through InFO via), and the like, are widely used for signal and/or power transmission. Typically, the transmission is conducted by a conductor filled into a via, such as Cu. However, as the signal frequency increases, the transmission efficiency may decrease significantly due to skin effect. When the frequency increases, the conductive area through which a current pass decreases, and the current will more concentrate on a surface of the conductor. As such, the resistance of the conductor increases, and the transmission efficiency of the via structure is deteriorated.

SUMMARY

The disclosure is directed to provide a via structure which is suitable for the high frequency transmission.

According to some embodiments, a semiconductor structure is provided. The semiconductor structure comprises a substrate and a via structure. The via structure is through the substrate. The via structure comprises a first conductive portion, a second conductive portion, a first barrier portion, a second barrier portion, and a third barrier portion. The first conductive portion has a ring-shaped cross section. The second conductive portion is disposed at an inner side of the first conductive portion. The second conductive portion has a ring-shaped cross section. The first barrier portion is disposed at an outer side of the first conductive portion. The second barrier portion is disposed between the first conductive portion and the second conductive portion. The third barrier portion is disposed at an inner side of the second conductive portion. At least one of the first barrier portion, the second barrier portion, or the third barrier portion comprises an insulating 2D material.

According to some embodiments, a method for manufacturing a semiconductor structure is provided. The method comprises following steps. First, an opening is formed through a substrate. A first barrier portion of a via structure is formed on a sidewall of the opening. A first conductive portion of the via structure is formed on the first barrier portion. A second barrier portion of the via structure is formed on the first conductive portion. A second conductive portion of the via structure is formed on the second barrier portion. A third barrier portion of the via structure is formed in a remaining space of the opening. At least one of the first barrier portion, the second barrier portion, or the third barrier portion is formed using an insulating 2D material.

Figure 1A:
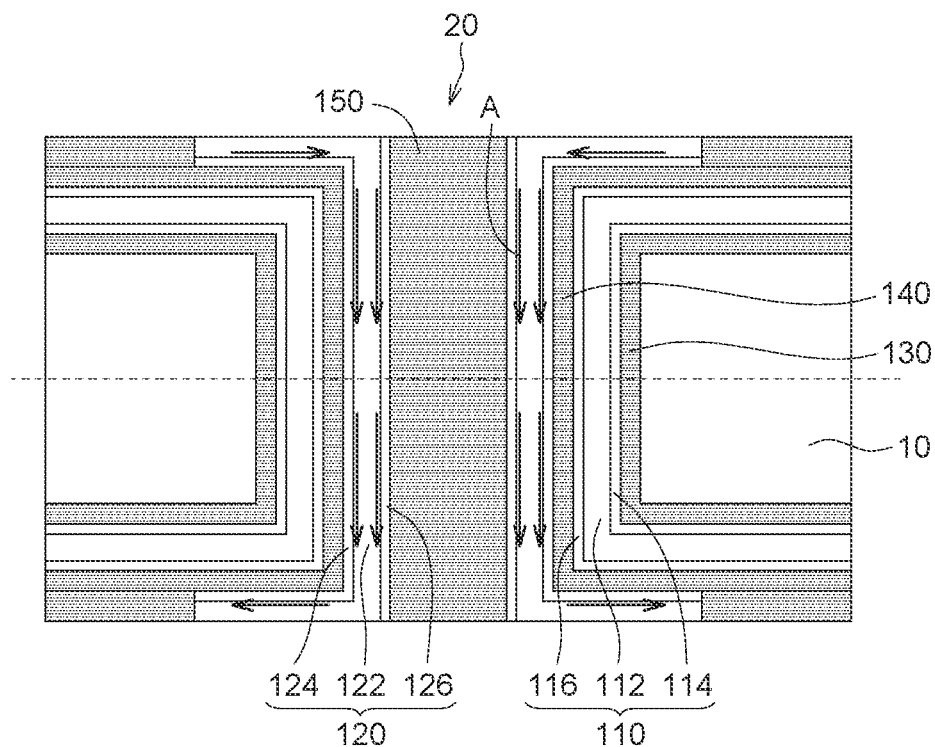
FIGS. 1A-1B illustrate an exemplary semiconductor structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. The following description and the accompanying drawings are provided for illustrative only, and not intended to result in a limitation. For clarity, the components may not be drawn to scale. In addition, some components and/or reference numerals may be omitted from some drawings. It is contemplated that the elements and features of one embodiment can be beneficially incorporated in another embodiment without further recitation.

Figure 1B:
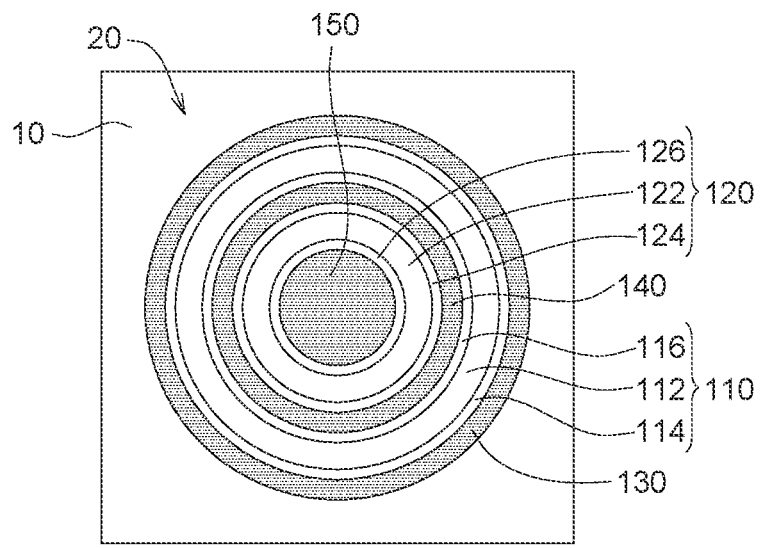

Referring to FIGS. 1A-1B, an exemplary semiconductor structure 100 according to embodiments is shown. The semiconductor structure 100 comprises a substrate 10 and a via structure 20. The via structure 20 is through the substrate 10. The via structure 20 comprises a first conductive portion 110, a second conductive portion 120, a first barrier portion 130, a second barrier portion 140, and a third barrier portion 150. The first conductive portion 110 has a ring-shaped cross section. The second conductive portion 120 is disposed at an inner side of the first conductive portion 110. The second conductive portion 120 has a ring-shaped cross section. The first barrier portion 130 is disposed at an outer side of the first conductive portion 110. The second barrier portion 140 is disposed between the first conductive portion 110 and the second conductive portion 120. The third barrier portion 150 is disposed at an inner side of the second conductive portion 120. At least one of the first barrier portion 130, the second barrier portion 140, or the third barrier portion 150 comprises an insulating 2D material.

Specifically, the substrate 10 may have a main body comprising silicon or the like. In addition to the main body, the substrate 10 may further include an electronic device (not shown in FIGS. 1A-1B) therein and/or thereon. Further details of which will be omitted herein so as not to obscure the disclosure.

The via structure 20 is through the substrate 10. In particular, the via structure 20 may penetrate through the substrate 10 from one surface to another surface of the substrate 10. The details of the via structure 20 will be described more fully hereinafter. Depending on the type of the substrate 10, the via structure 20 may be a TSV (through silicon via) structure, a TGV (through glass via) structure, a TPV (through polymer via) structure, a TMV (through mold via) structure, a TPV (through package via) structure, a TIV (through InFO via) structure, or the like. While only one via structure 20 is shown in FIGS. 1A-1B, it is contemplated that the number of the via structure 20 through the substrate 10 can be decided according to design, and the structure described herein may be applied to one or more of the via structures 20.

The cross section of the first conductive portion 110 may be a circular ring shape, an elliptical ring shape, a triangular ring shape, a rectangular ring shape, a square ring shape, or any other polygonal ring shape such as an octagonal ring shape or the like. In FIGS. 1A-1B, the cross section of the first conductive portion 110 is illustrated as a circular ring shape. According to some embodiments, the first conductive portion 110 may comprise a first conductive body 112 and two first conductive auxiliary layers 114 and 116. The first conductive auxiliary layers 114 and 116 are disposed at an outer side and an inner side of the first conductive body 112, respectively. The first conductive body 112 may be formed of any suitable low resistance metallic material, such as Cu, Co, Al, Ru, or the like, but the disclosure is not limited thereto. The first conductive auxiliary layers 114 and 116 may be formed of a conductive 2D material. According to some embodiments, the conductive 2D material has a resistivity equal to or lower than 0.25 $\Omega\cdot\mu m$. For example, graphene or a transition metal dichalcogenide such as $VSe_2$, $PtTe_2$, $VS_2$, or $PtSe_2$ may be used. In some embodiments, the conductive 2D material is graphene, and a thickness of the first conductive auxiliary layer 114 and a thickness of the first conductive auxiliary layer 116 may be 0.35 nm to 50 nm, such as 0.4 nm to 50 nm. When a thickness of graphene is about 0.35 nm to about 10 nm, resistivity thereof may be about 0.02 $\Omega\cdot\mu m$ to about 0.25 $\Omega\cdot\mu m$. It is noted that, in such scale, conductivity of graphene reduces as the thickness increases due to inhibited carrier mobility. In some embodiments, the conductive 2D material is a transition metal dichalcogenide, and a thickness of the first conductive auxiliary layer 114 and a thickness of the first conductive auxiliary layer 116 may be 5 nm to 200 nm, such as 8 nm to 200 nm. When a thickness of $PtSe_2$ is 8 nm, resistivity thereof may be about 625 $\Omega\cdot\mu m$. The transition metal dichalcogenide may transform from semimetal to semiconductor when the thickness further decreases. This will lead to a significant decrease of the conductivity.

The cross section of the second conductive portion 120 may be a circular ring shape, an elliptical ring shape, a triangular ring shape, a rectangular ring shape, a square ring shape, or any other polygonal ring shape such as an octagonal ring shape or the like. The shape of the cross section of the second conductive portion 120 may be different from the shape of the cross section of the first conductive portion 110. In FIGS. 1A-1B, the cross section of the second conductive portion 120 is illustrated as a circular ring shape. According to some embodiments, the second conductive portion 120 may be coaxial with the first conductive portion 110. According to some embodiments, the second conductive portion 120 may comprise a second conductive body 122 and two second conductive auxiliary layers 124 and 126. The second conductive auxiliary layers 124 and 126 are disposed at an outer side and an inner side of the second conductive body 122, respectively. The second conductive body 122 may be formed of any suitable low resistance metallic material, such as Cu, Co, Al, Ru, or the like, but the disclosure is not limited thereto. The second conductive auxiliary layers 124 and 126 may be formed of a conductive 2D material, such as graphene or a transition metal dichalcogenide like $VSe_2$, $PtTe_2$, $VS_2$, or $PtSe_2$. In some embodiments, the conductive 2D material is graphene, and a thickness of the first conductive auxiliary layer 124 and a thickness of the first conductive auxiliary layer 126 may be 0.35 nm to 50 nm, such as 0.4 nm to 50 nm. In some embodiments, the conductive 2D material is a transition metal dichalcogenide, and a thickness of the first conductive auxiliary layer 124 and a thickness of the first conductive auxiliary layer 126 may be 5 nm to 200 nm, such as 8 nm to 200 nm. According to some embodiments, at least one layer of the two first conductive auxiliary layers 114, 116 or the two second conductive auxiliary layers 124, 126 comprises a conductive 2D material. As described above, the conductive 2D material may be graphene or a transition metal dichalcogenide.

The first barrier portion 130, the second barrier portion 140, and the third barrier portion 150 are individually formed of barrier materials. As such, they can prevent metals in the first conductive portion 110 and the second conductive portion 120 from diffusing into other components of the semiconductor structure 100. At least one of the first barrier portion 130, the second barrier portion 140, or the third barrier portion 150 comprises an insulating 2D material. For example, the second barrier portion 140 may comprise the insulating 2D material. The insulating 2D material itself may be low-k barrier material, of which the k-value is lower than $SiO_2$. For example, the insulating 2D material may be hexagonal BN (h-BN), $CaF_2$, or any other suitable insulating 2D material. Three or four layers of hexagonal BN is sufficient for prevent the diffusion of Cu. The insulating 2D material can form a better interface with metal to reduce resistive impedance.

The via structure according to the disclosure, which comprising an outer first conductive portion and an inner second conductive portion, can ensure better signal integrity for high frequency transmission compared to a conventional via structure or a conventional via pair structure. For example, the via structure according to the disclosure can maintain a low insertion loss ($S_{21}$) even at a high frequency. In addition, ring-shaped cross sections can increase the effective conductive area. In some embodiments, the first conductive portion and the second conductive portion are isolated from each other by a second barrier portion formed of an insulating 2D material. Using a low-k barrier portion formed of the insulating 2D material between the outer first conductive portion and the inner second conductive portion will be more beneficial for high frequency transmission compared to the case using a conventional barrier material such as $SiO_2$, $Si_3N_4$, or a polymeric material. In some embodiments, the first conductive portion and the second conductive portion have conductive auxiliary layers. The conductive auxiliary layers formed of a conductive 2D material can reducing inelastic scattering at metal surfaces, and thus the conductivity can be further improved. According to some embodiments, the second conductive portion is a signal-carrying portion, as indicated by arrows A, and the first conductive portion is a ground portion.

Figure 2:
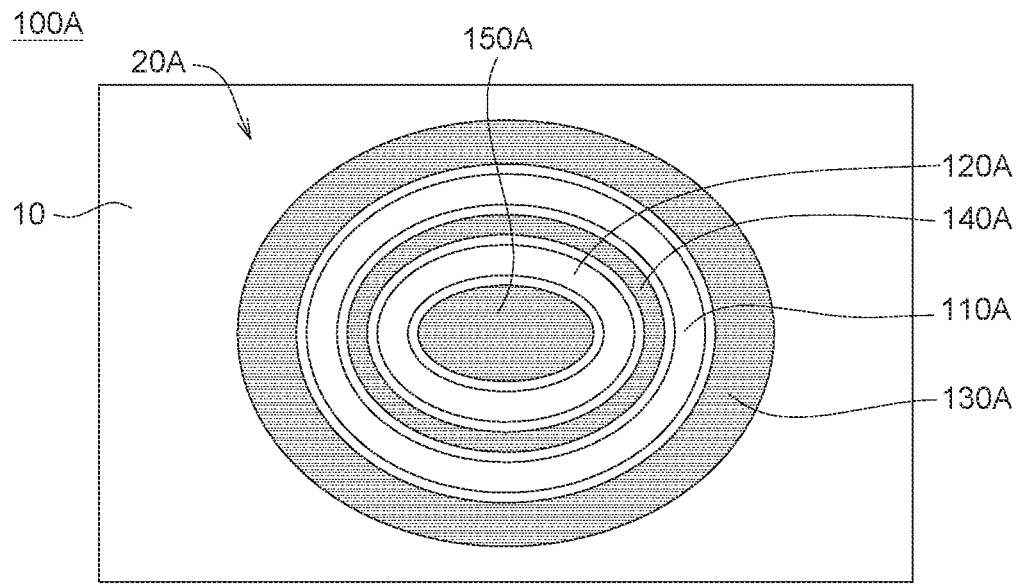
FIG. 2 illustrates an exemplary semiconductor structure according to embodiments.

Various modifications may be possible to the semiconductor structure according to the disclosure. Referring to FIG. 2, an exemplary semiconductor structure 100A according to embodiments is shown. In the via structure 20A of the semiconductor structure 100A, the cross sections of the first conductive portion 110A and the second conductive portion 120A are elliptical ring shapes, and the first barrier portion 130A, the second barrier portion 140A, and the third barrier portion 150A are disposed correspondingly. Other details are similar to those of the semiconductor structure 100, and will be omitted herein.

Figure 3:
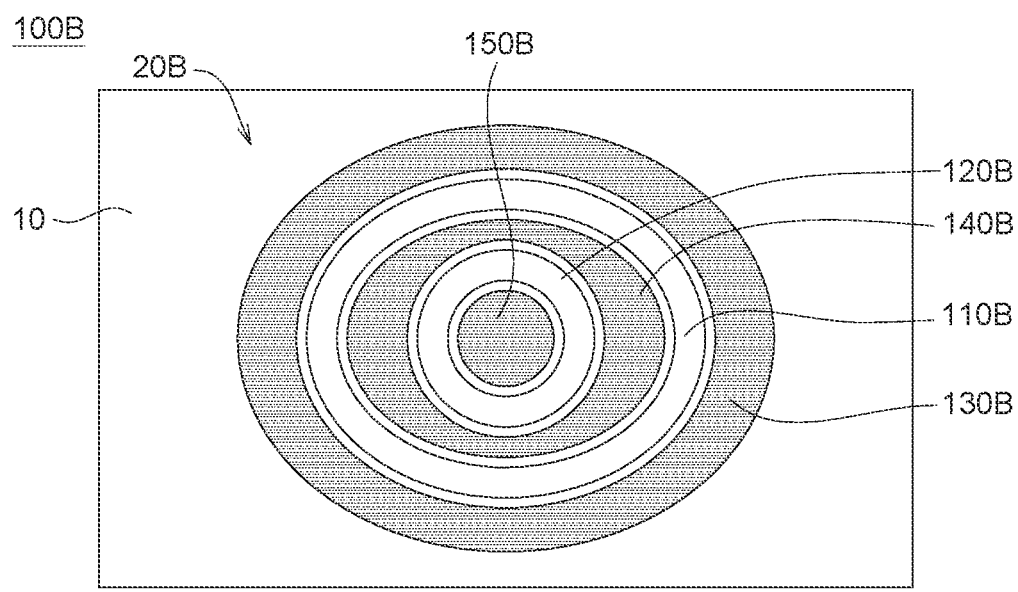
FIG. 3 illustrates an exemplary semiconductor structure according to embodiments.

Referring to FIG. 3, an exemplary semiconductor structure 100B according to embodiments is shown. In the via structure 20B of the semiconductor structure 100B, the cross section of the first conductive portion 110B is an elliptical ring shape, the cross section of the second conductive portion 120B is a circular ring shape, and the first barrier portion 130B, the second barrier portion 140B, and the third barrier portion 150B are disposed correspondingly. Other details are similar to those of the semiconductor structure 100, and will be omitted herein.

Figure 4:
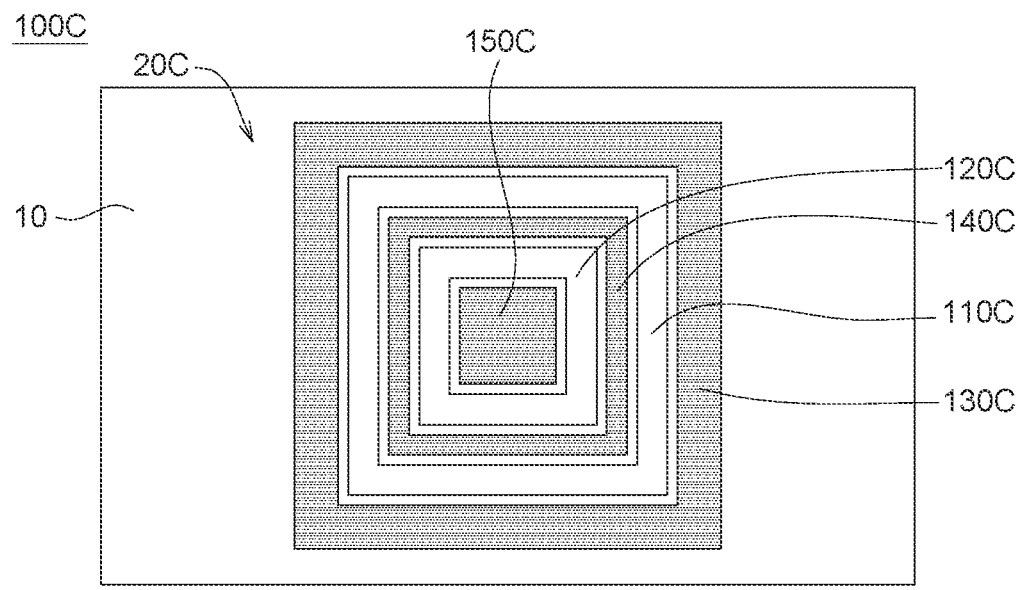
FIG. 4 illustrates an exemplary semiconductor structure according to embodiments.

Referring to FIG. 4, an exemplary semiconductor structure 100C according to embodiments is shown. In the via structure 20C of the semiconductor structure 100C, the cross sections of the first conductive portion 110C and the second conductive portion 120C are square ring shapes, and the first barrier portion 130C, the second barrier portion 140C, and the third barrier portion 150C are disposed correspondingly. Square or rectangular via structures have superior performance in terms of return loss and insertion loss. Other details are similar to those of the semiconductor structure 100, and will be omitted herein.

Figure 5:
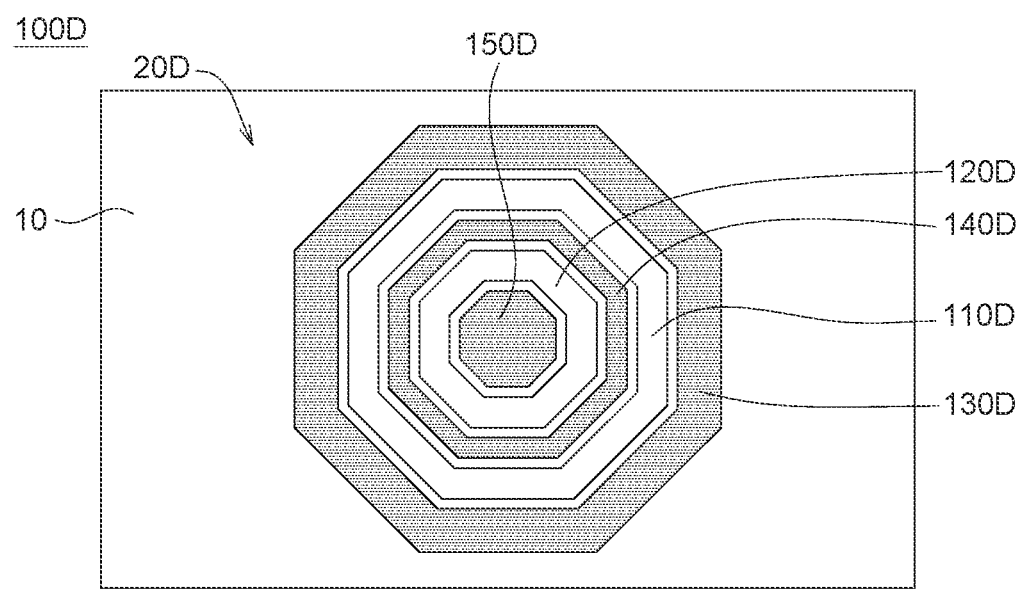
FIG. 5 illustrates an exemplary semiconductor structure according to embodiments.

Referring to FIG. 5, an exemplary semiconductor structure 100D according to embodiments is shown. In the via structure 20D of the semiconductor structure 100D the cross sections of the first conductive portion 110D and the second conductive portion 120D are octagonal ring shapes, and the first barrier portion 130D, the second barrier portion 140D, and the third barrier portion 150D are disposed correspondingly. Octagonal via structures show a good result in terms of electric field coupling. Other details are similar to those of the semiconductor structure 100, and will be omitted herein.

Figure 6:
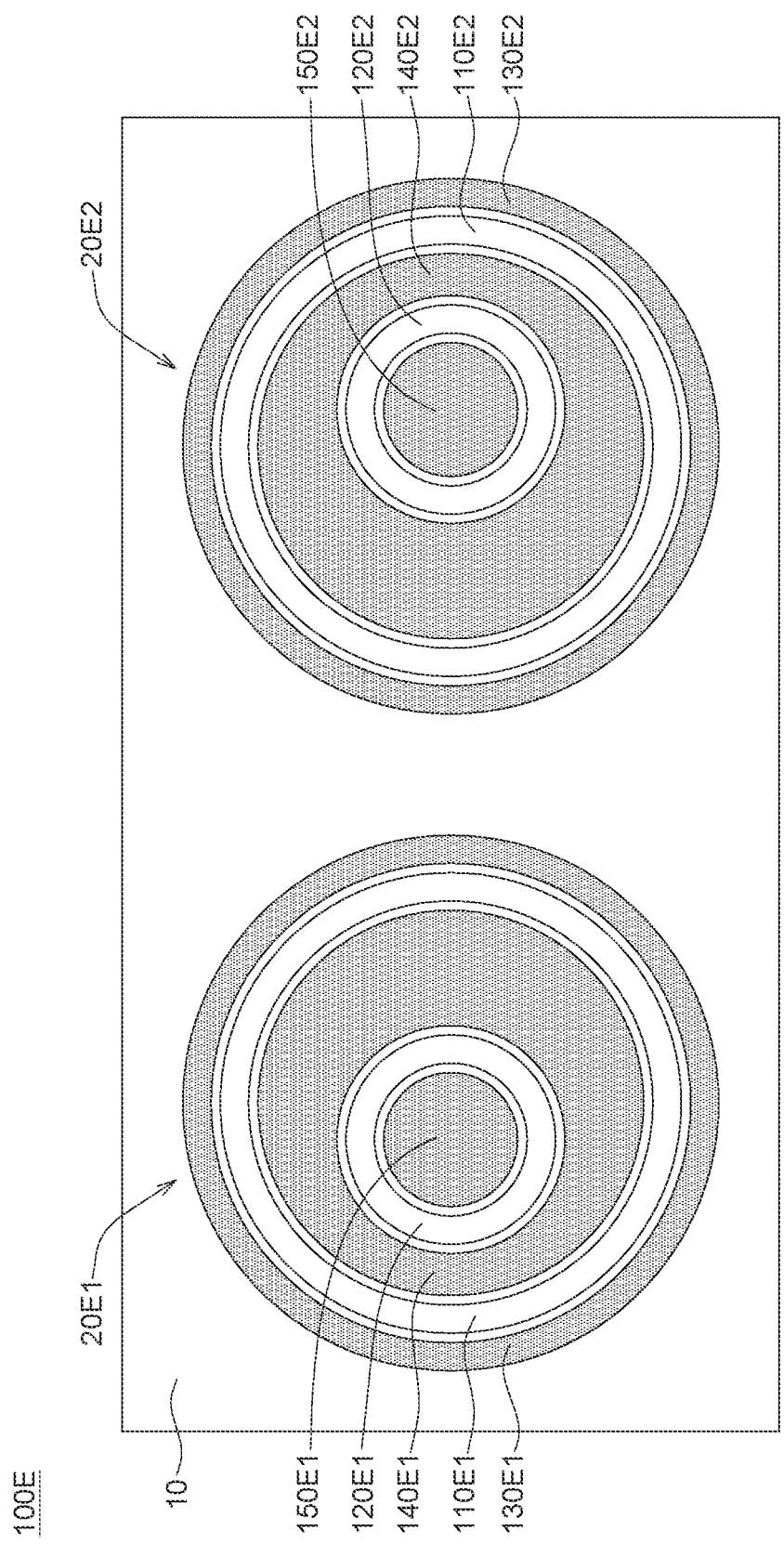
FIG. 6 illustrates an exemplary semiconductor structure according to embodiments.

Referring to FIG. 6, an exemplary semiconductor structure 100E according to embodiments is shown. The semiconductor structure 100E comprises neighboring two via structures 20E1 and 20E2. The second conductive portions 120E1 and 120E2 of the two via structures 20E1 and 20E2 are disposed away from each other. More specifically, the second conductive portions 120E1 and 120E2 are disposed away from each other relative to centroids of the first conductive portions 110E1 and 110E2. The first barrier portions 130E1 and 130E2, the second barrier portions 140E1 and 140E2, and the third barrier portions 150E1 and 150E2 are disposed correspondingly. As shown in FIG. 6, a semiconductor structure according to the disclosure may have a non-coaxial ring-shaped via structure. This may be suitable for some fabrication process or specific application. Other details are similar to those of the semiconductor structure 100, and will be omitted herein.

Figure 7:
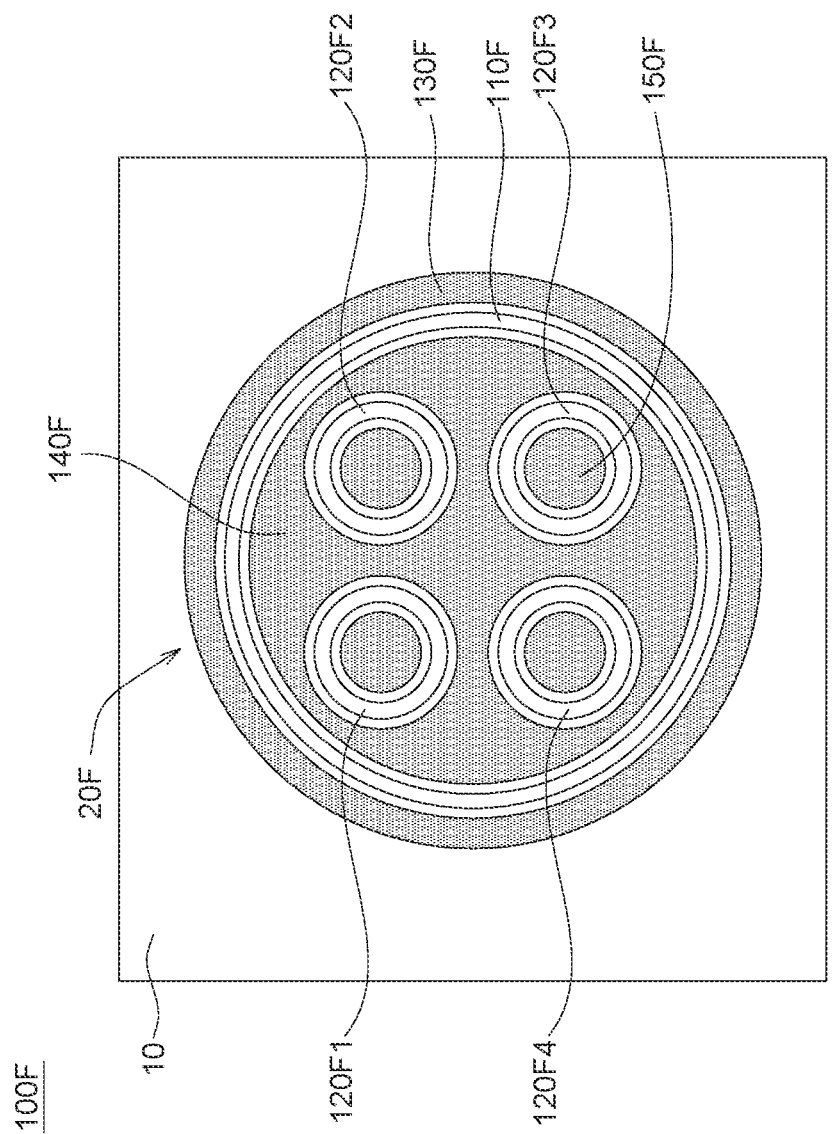
FIG. 7 illustrates an exemplary semiconductor structure according to embodiments.

Referring to FIG. 7, an exemplary semiconductor structure 100F according to embodiments is shown. In the semiconductor structure 100F, the via structure 20F comprises two or more second conductive portions separated from each other. In FIG. 7, four second conductive portions 120F1, 120F2, 120F3, and 120F4 are illustrated. The semiconductor structure 100F further comprises two or more third barrier portions 150F disposed at the inner sides of the two or more second conductive portions, respectively. The first conductive portion 110F, the first barrier portion 130F, the second barrier portion 140F, and the third barrier portion 150F are disposed correspondingly. As shown in FIG. 7, a semiconductor structure according to the disclosure may have multiple inner ring-shaped conductive portions. In some further embodiments, the inner ring-shaped conductive portions may have different shapes and/or diameters. Other details are similar to those of the semiconductor structure 100, and will be omitted herein.

Figure 8:
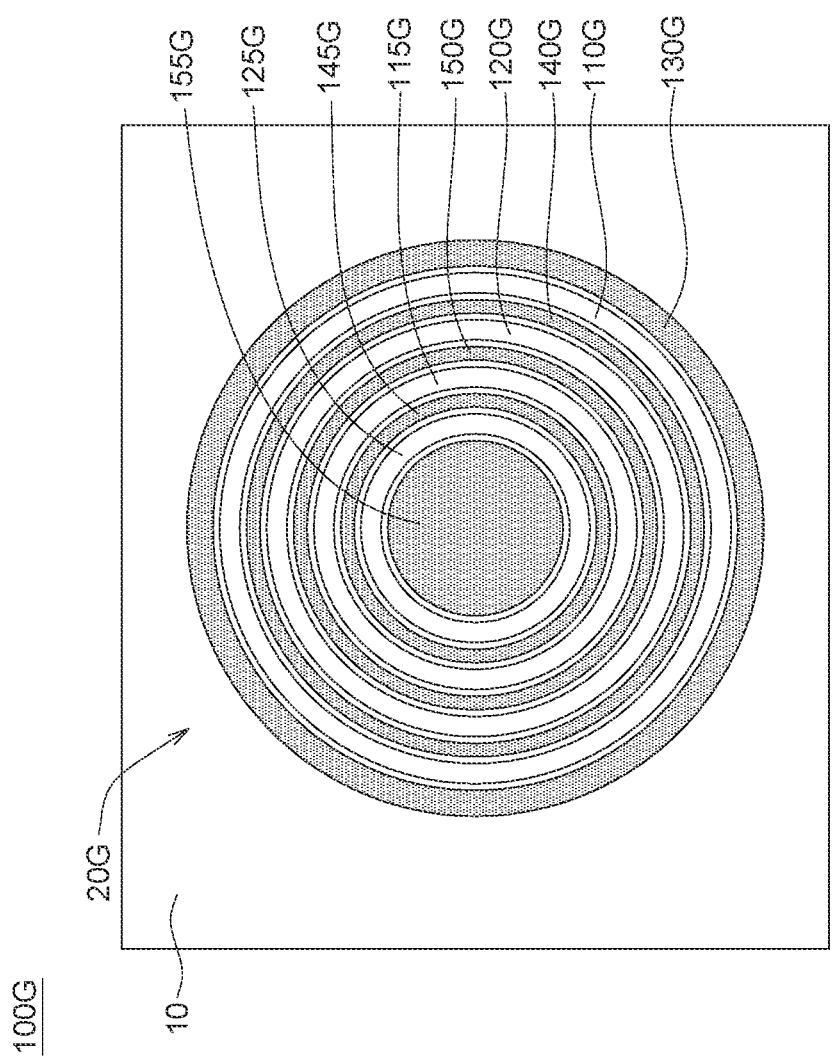
FIG. 8 illustrates an exemplary semiconductor structure according to embodiments.

Referring to FIG. 8, an exemplary semiconductor structure 100G according to embodiments is shown. In addition to the first conductive portion 110G, the second conductive portion 120G, the first barrier portion 130G, the second barrier portion 140G, and the third barrier portion 150G, the via structure 20G further comprises a third conductive portion 115G, a fourth conductive portion 125G, a fourth barrier portion 145G, and a fifth barrier portion 155G. The third conductive portion 115G is disposed at an inner side of the second conductive portion 120G. The third conductive portion 115G has a ring-shaped cross section. The fourth conductive portion 125G is disposed at an inner side of the third conductive portion 115G. The fourth conductive portion 125G has a ring-shaped cross section. The third barrier portion 150G is disposed between the second conductive portion 120G and the third conductive portion 115G. The fourth barrier portion 145G is disposed between the third conductive portion 115G and the fourth conductive portion 125G. The fifth barrier portion 155G is disposed at an inner side of the fourth conductive portion 125G. The via structure 20G can be realized as two via structures with one via structure disposed in an inner side of the other one. As shown in FIG. 8, a semiconductor structure according to the disclosure may have multiple conductive portions disposed sequentially. In some further embodiments, the conductive portions may have different shapes. According to some further embodiments, the conductive portions may be coaxial or non-coaxial with one another. Other details are similar to those of the semiconductor structure 100, and will be omitted herein.

Now the description is directed to a method for manufacturing the semiconductor structure according to embodiments. The method comprises following steps. First, an opening is formed through a substrate. A first barrier portion of a via structure is formed on a sidewall of the opening. A first conductive portion of the via structure is formed on the first barrier portion. A second barrier portion of the via structure is formed on the first conductive portion. A second conductive portion of the via structure is formed on the second barrier portion. A third barrier portion of the via structure is formed in a remaining space of the opening. At least one of the first barrier portion, the second barrier portion, or the third barrier portion is formed using an insulating 2D material.

Figure 9A:
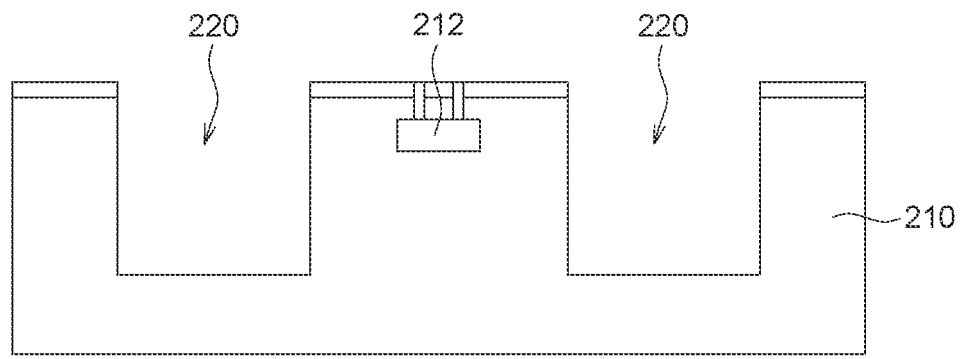
FIGS. 9A-9N illustrate various stages of an exemplary method for manufacturing a semiconductor structure according to embodiments.
Figure 9B:
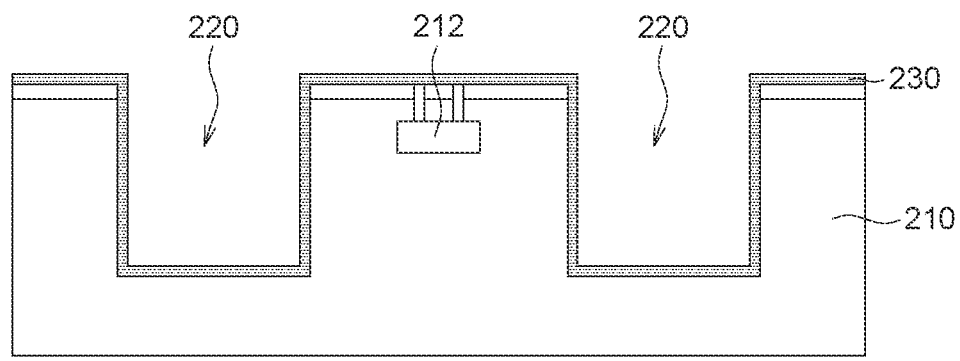
Figure 9C:
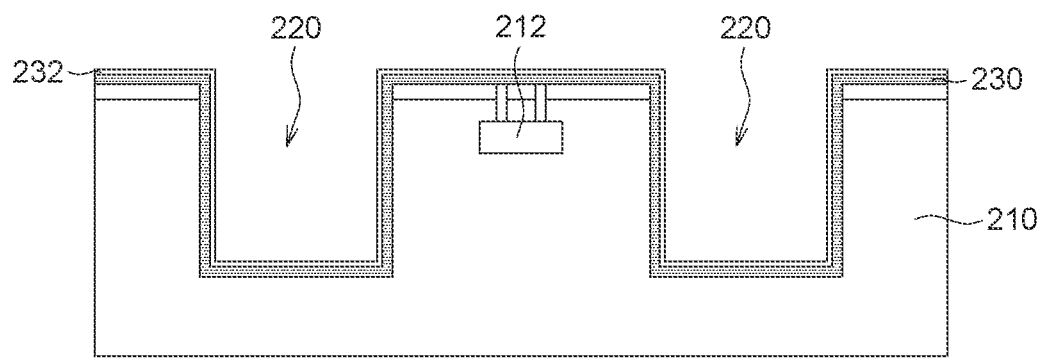
Figure 9D:
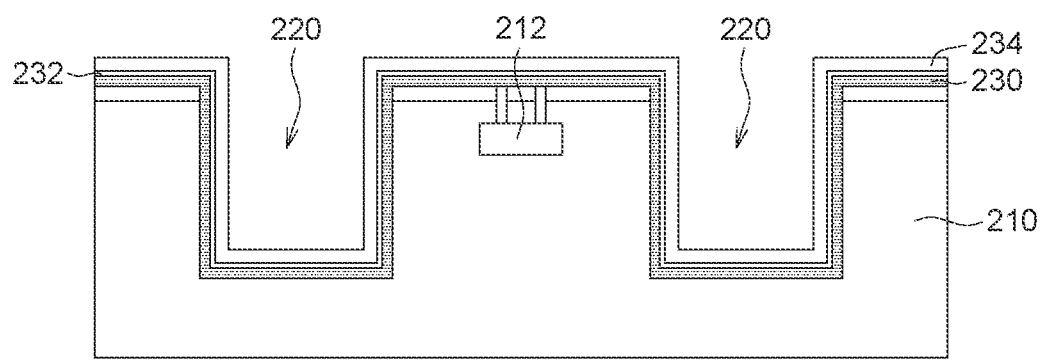
Figure 9E:
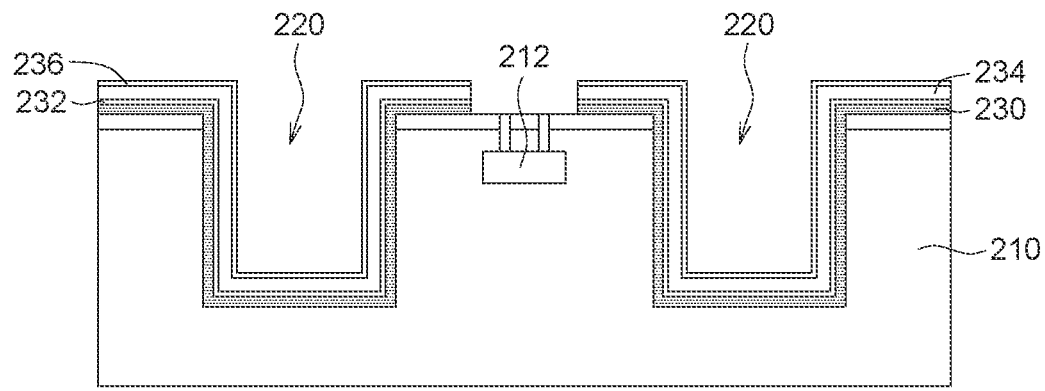
Figure 9F:
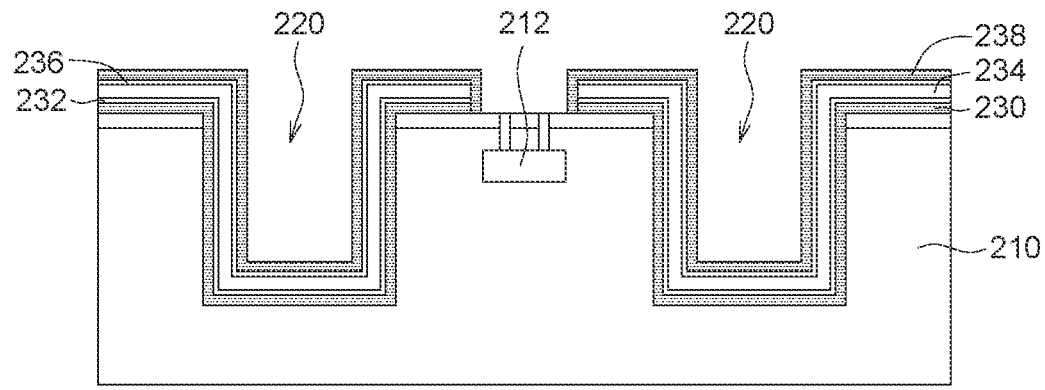
Figure 9G:
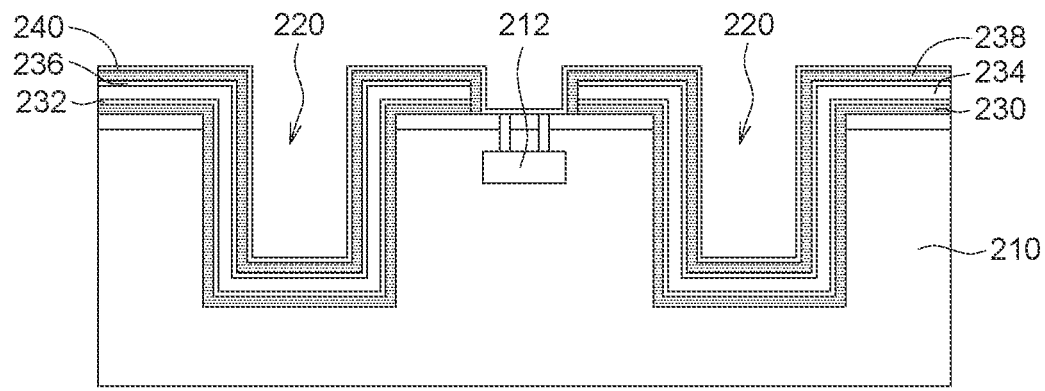
Figure 9H:
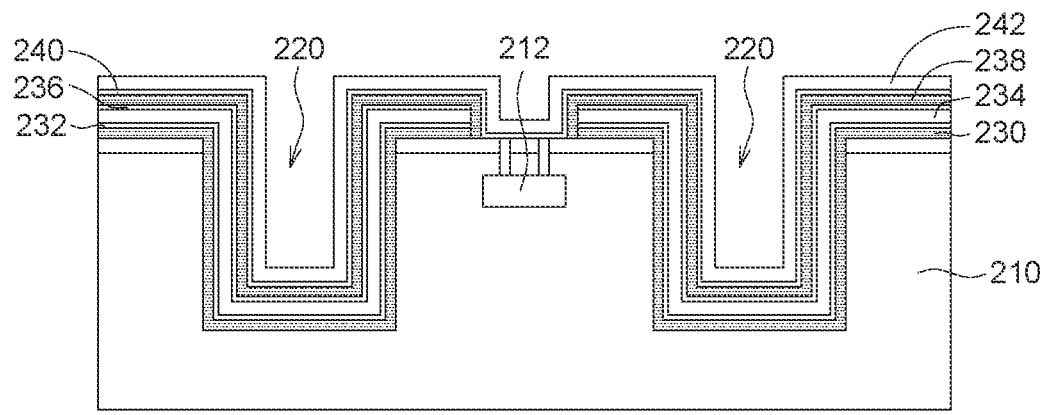
Figure 9I:
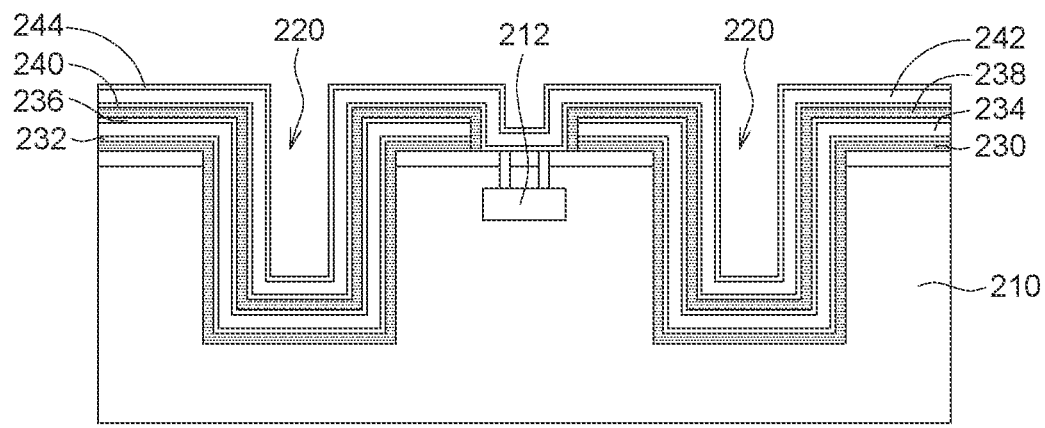
Figure 9J:
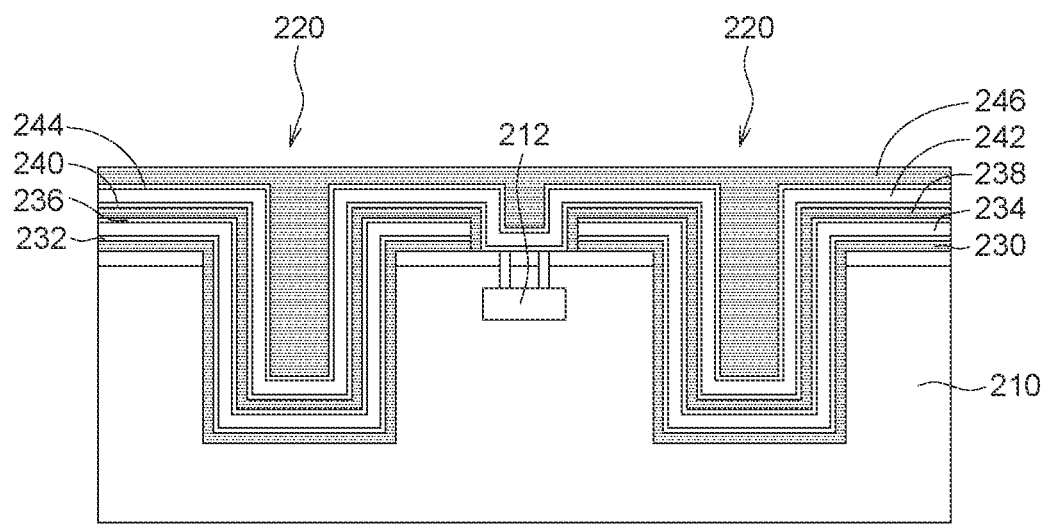
Figure 9K:
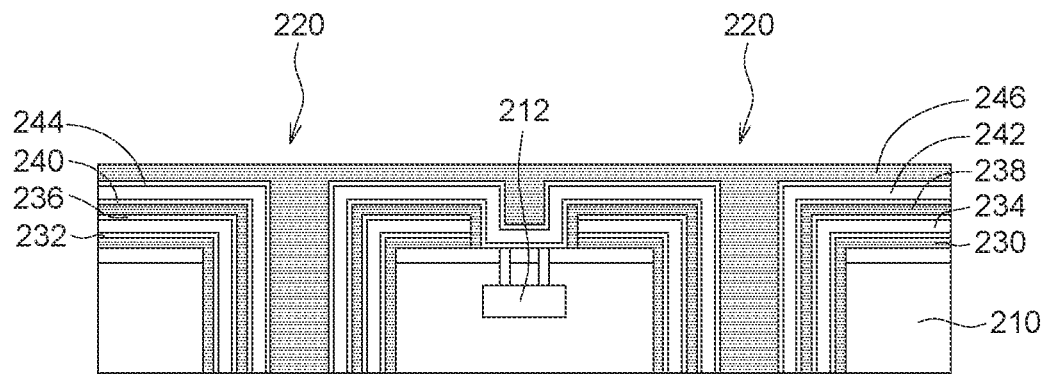
Figure 9L:
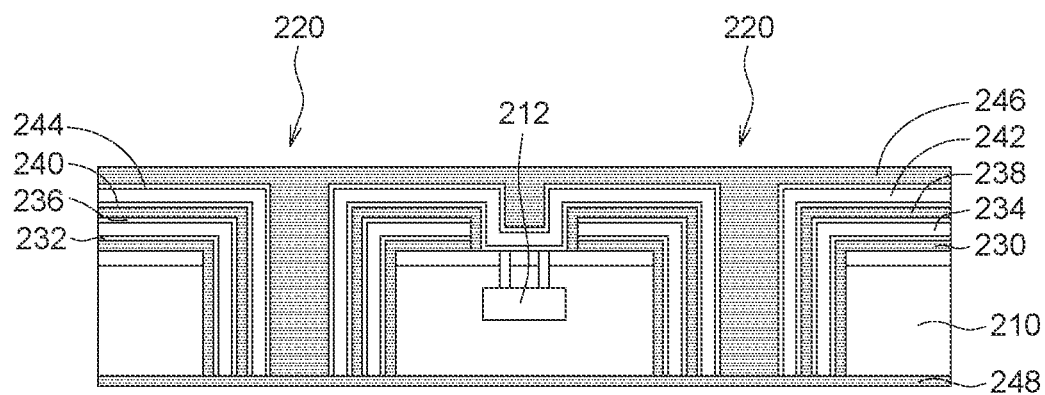
Figure 9M:
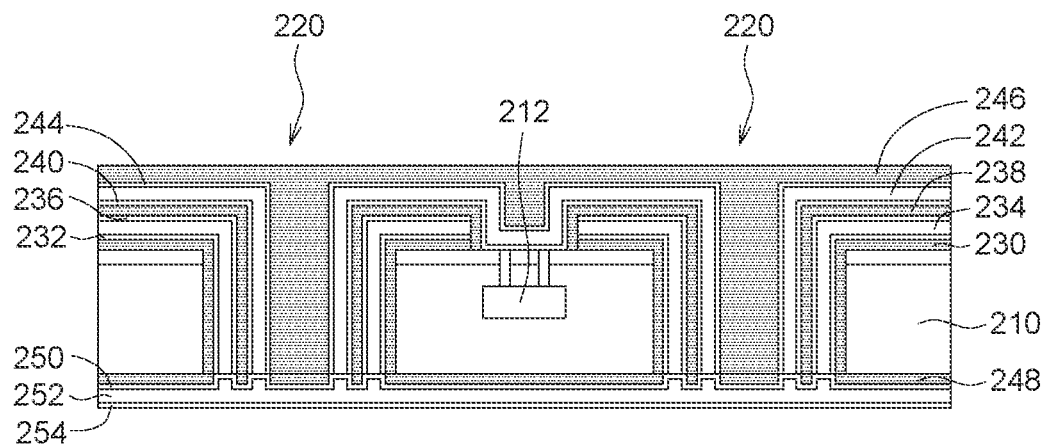
Figure 9N:
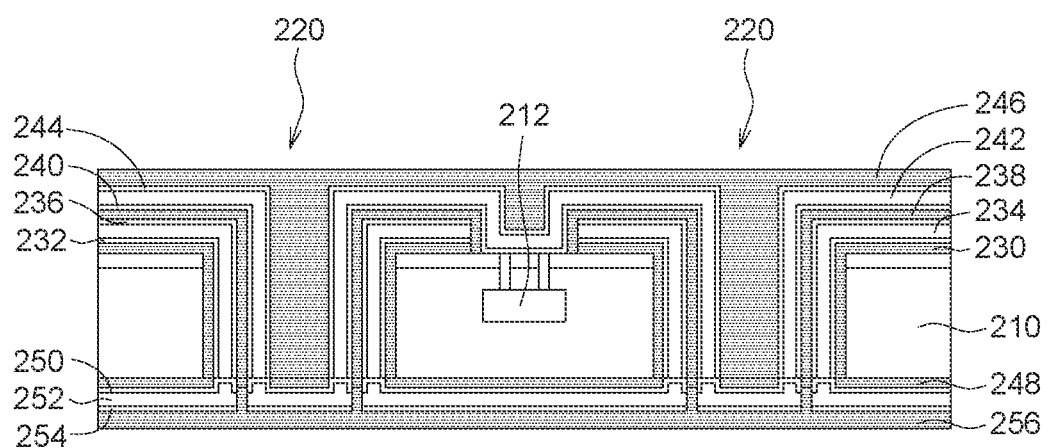

Referring to FIGS. 9A-9N, an exemplary method for manufacturing a semiconductor structure according to embodiments is shown. A blind via process is applied in the method illustrated in FIGS. 9A-9N to form a via structure.

Before the stage shown in FIG. 9A, a substrate 210 may have been treated, such as with a conventional CMOS process stopping at a chemical mechanical planarization (CMP) process of first level metal or W plug, but the disclosure is not limited thereto. For example, an electronic device 212 as shown in FIG. 9A is formed in the substrate 210 before the stage of FIG. 9A.

As shown in FIG. 9A, an opening 220 is formed through the substrate 210. The opening 220 may be fabricated by a Bosch process, but the disclosure is not limited thereto.

As shown in FIG. 9B, a material 230 for forming a first barrier portion of a via structure is conformally provided on the substrate 210 with the opening 220. As such, the first barrier portion of the via structure can be formed on a sidewall of the opening 220. The material 230 can be provided by a thermal CVD process, a plasma-enhanced CVD process, or any other suitable fabrication process. The material 230 may be an insulating 2D material, such as hexagonal BN, $CaF_2$, or the like.

As shown in FIG. 9C, a material 232 for forming a first conductive auxiliary layer is conformally provided on the material 230 for forming the first barrier portion. As such, the material 232 for forming the first conductive auxiliary layer can be conformally provided on the first barrier portion of the via structure. The material 232 can be provided by a thermal CVD process, a plasma-enhanced CVD process, or any other suitable fabrication process. The material 232 may be a conductive 2D material, such as graphene, a transition metal dichalcogenide like $VSe_2$, $PtTe_2$, $VS_2$, or $PtSe_2$, or the like.

As shown in FIG. 9D, a material 234 for forming a first conductive body is conformally provided on the material 232 for forming the first conductive auxiliary layer. The material 234 can be provided by any suitable deposition process. The material 234 may be Cu, Co, Al, Ru, or the like.

As shown in FIG. 9E, a material 236 for forming another first conductive auxiliary layer on the material 234 for forming the first conductive body. The material 236 can be provided by a thermal CVD process, a plasma-enhanced CVD process, or any other suitable fabrication process. The material 236 may be a conductive 2D material, such as graphene, a transition metal dichalcogenide like $VSe_2$, $PtTe_2$, $VS_2$, or $PtSe_2$, or the like.

A first conductive portion of the via structure can thus be formed on the first barrier portion. According to some embodiments, a ground metal definition process can be conducted such that the first conductive portion is not coupled to the electronic device 212. As such, the first conductive portion may be used as a ground portion, and will not be electrically connected to the electronic device 212.

As shown in FIG. 9F, a material 238 for forming a second barrier portion of the via structure is conformally provided. As such, the second barrier portion of the via structure can be formed on the first conductive portion. The material 238 can be provided by a thermal CVD process, a plasma-enhanced CVD process, or any other suitable fabrication process. The material 238 may be an insulating 2D material, such as hexagonal BN, $CaF_2$, or the like.

In some embodiments, the configuration of the material 238, particular the portion in the opening 220, can be further modified, such that a second conductive portion formed thereafter may have a cross-sectional shape different from the first conductive portion. As such, a cross section of the first conductive portion and a cross section of the second conductive portion may be individually a circular ring shape, an elliptical ring shape, a triangular ring shape, a rectangular ring shape, a square ring shape, an octagonal ring shape, or the like.

As shown in FIG. 9G, a material 240 for forming a second conductive auxiliary layer is conformally provided on the material 238 for forming the second barrier portion. As such, the material 240 for forming the second conductive auxiliary layer can be conformally provided on the second barrier portion. The material 240 can be provided by a thermal CVD process, a plasma-enhanced CVD process, or any other suitable fabrication process. The material 240 may be a conductive 2D material, such as graphene, a transition metal dichalcogenide like $VSe_2$, $PtTe_2$, $VS_2$, or $PtSe_2$, or the like.

As shown in FIG. 9H, a material 242 for forming a second conductive body is conformally provided on the material 240 for forming the second conductive auxiliary layer. The material 242 can be provided by any suitable deposition process. The material 242 may be Cu, Co, Al, Ru, or the like.

As shown in FIG. 9I, a material 244 for forming another second conductive auxiliary layer is conformally provided on the material 242 for forming the second conductive body. The material 244 can be provided by a thermal CVD process, a plasma-enhanced CVD process, or any other suitable fabrication process. The material 244 may be a conductive 2D material, such as graphene, a transition metal dichalcogenide like $VSe_2$, $PtTe_2$, $VS_2$, or $PtSe_2$, or the like. According to some embodiments, at least one of the material 232 for forming the first conductive auxiliary layer, the material 236 for forming the another first conductive auxiliary layer, the material 240 for forming the second conductive auxiliary layer, or the material 244 for forming the another second conductive auxiliary layer is a conductive 2D material, which may be graphene or a transition metal dichalcogenide.

A second conductive portion of the via structure can thus be formed on the second barrier portion. The second conductive portion is coupled to the electronic device 212, and may be used as a signal-carrying portion.

As shown in FIG. 9J, a material 246 for forming a third barrier portion of the via structure is provided and filled into the opening 220. As such, the third barrier portion of the via structure can be formed in a remaining space of the opening 220. The material 246 can be provided by a thermal CVD process, a plasma-enhanced CVD process, or any other suitable fabrication process. The material 246 may be an insulating 2D material, such as hexagonal BN, $CaF_2$, or the like, According to some embodiments, at least one of the first barrier portion, the second barrier portion, or the third barrier portion is formed using an insulating 2D material, which may be hexagonal BN or $CaF_2$.

As shown in FIG. 9K, a backside grinding process is conducted to expose the opening 220 from a backside of the substrate 210.

As shown in FIG. 9L, a material 248 for forming a first backside barrier portion is provided on a lower surface of the substrate 210. As such, the first backside barrier portion can be formed on the lower surface of the substrate 210. The material 248 can be provided by a thermal CVD process, a plasma-enhanced CVD process, or any other suitable fabrication process. The material 248 may be an insulating 2D material, such as hexagonal BN, $CaF_2$, or the like.

As shown in FIG. 9M, a material 250 for forming a backside conductive auxiliary layer, a material 252 for forming a backside conductive body, and a material 254 for forming another backside conductive auxiliary layer are sequentially provided on the material 248 for forming the first backside barrier portion. The material 250, the material 252, and the material 254 may be provided in manners similar to the material 232/240, the material 234/242, and the material 236/244, respectively.

As shown in FIG. 9N, a backside routing definition process can be applied to the material 250, the material 252, and the material 254. A backside conductive portion can thus be formed on the first backside barrier portion.

A material 256 for forming a second backside barrier portion is provided on the material 254. As such, the second backside barrier portion can be formed on the backside conductive portion. The material 256 can be provided by a thermal CVD process, a plasma-enhanced CVD process, or any other suitable fabrication process. The material 256 may be an insulating 2D material, such as hexagonal BN, $CaF_2$, or the like.

Referring to FIGS. 10A-10K, another exemplary method for manufacturing a semiconductor structure according to embodiments is shown. A through via process is applied in the method illustrated in FIGS. 10A-10K to form a via structure.

Figure 10A:
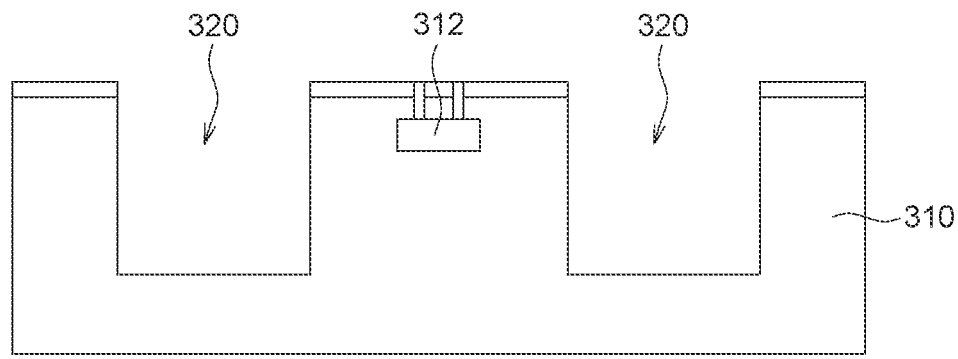
FIGS. 10A-10K illustrate various stages of an exemplary method for manufacturing a semiconductor structure according to embodiments.

Before the stage shown FIG. 10A, a substrate 310 may have been treated, such as with a conventional CMOS process stopping at a chemical mechanical planarization (CMP) process of first level metal or W plug, but the disclosure is not limited thereto. For example, an electronic device 312 as shown in FIG. 10A is formed in the substrate 310 before the stage of FIG. 10A.

As shown in FIG. 10A, an opening 320 is formed through the substrate 310. The opening 320 may be fabricated by a Bosch process, but the disclosure is not limited thereto.

Figure 10B:
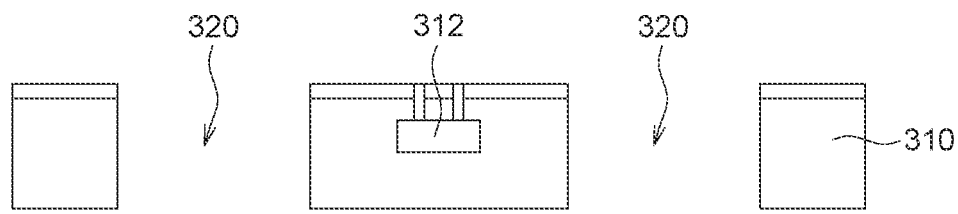

As shown in FIG. 10B, a backside grinding process is conducted to expose the opening 320 from a backside of the substrate 310.

Figure 10C:
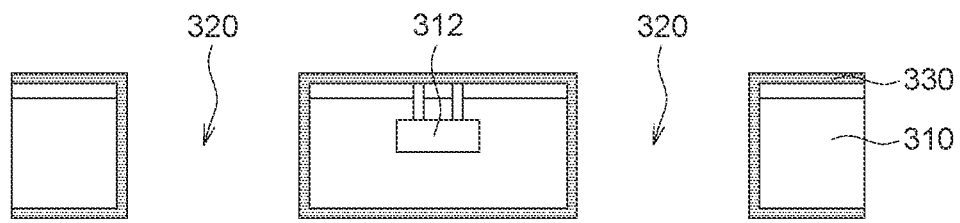

As shown in FIG. 10C, a material 330 for forming a first barrier portion of a via structure is conformally provided on the substrate 310 with the opening 320. As such, the first barrier portion of the via structure can be formed on a sidewall of the opening 320. The material 330 can be provided by a thermal CVD process, a plasma-enhanced CVD process, or any other suitable fabrication process. The material 330 may be an insulating 2D material, such as hexagonal BN, $CaF_2$, or the like.

Figure 10D:
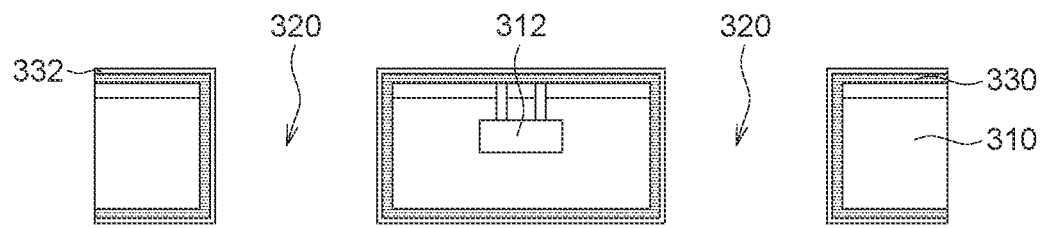

As shown in FIG. 10D, a material 332 for forming a first conductive auxiliary layer is conformally provided on the material 330 for forming the first barrier portion. As such, the material 332 for forming the first conductive auxiliary layer can be conformally provided on the first barrier portion of the via structure. The material 332 can be provided by a thermal CVD process, a plasma-enhanced CVD process, or any other suitable fabrication process. The material 332 may be a conductive 2D material, such as graphene, a transition metal dichalcogenide like $VSe_2$, $PtTe_2$, $VS_2$, or $PtSe_2$, or the like.

Figure 10E:
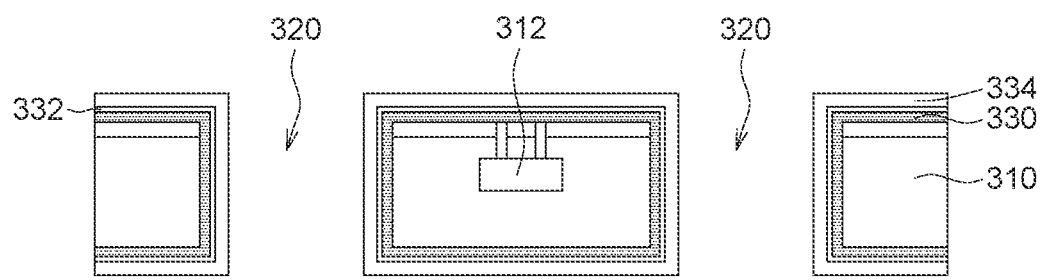

As shown in FIG. 10E, a material 334 for forming a first conductive body is conformally provided on the material 332 for forming the first conductive auxiliary layer. The material 334 can be provided by any suitable deposition process. The material 334 may be Cu, Co, Al, Ru, or the like.

Figure 10F:
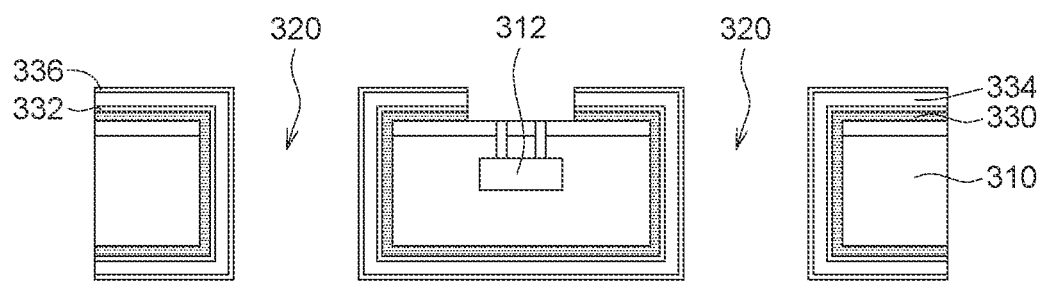

As shown in FIG. 10F, a material 336 for forming another first conductive auxiliary layer on the material 334 for forming the first conductive body. The material 336 can be provided by a thermal CVD process, a plasma-enhanced CVD process, or any other suitable fabrication process. The material 336 may be a conductive 2D material, such as graphene, a transition metal dichalcogenide like $VSe_2$, $PtTe_2$, $VS_2$, or $PtSe_2$, or the like.

A first conductive portion of the via structure can thus be formed on the first barrier portion. According to some embodiments, a ground metal definition process can be conducted such that the first conductive portion is not coupled to the electronic device 312. As such, the first conductive portion may be used as a ground portion, and will not be electrically connected to the electronic device 312.

Figure 10G:
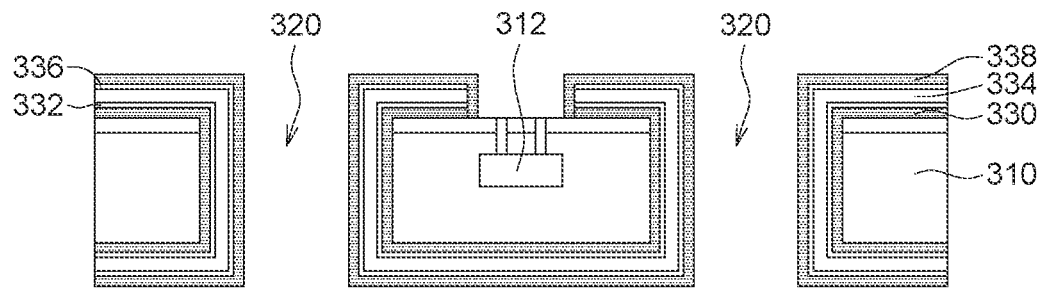

As shown in FIG. 10G, a material 338 for forming a second barrier portion of the via structure is conformally provided. As such, the second barrier portion of the via structure can be formed on the first conductive portion. The material 338 can be provided by a thermal CVD process, a plasma-enhanced CVD process, or any other suitable fabrication process. The material 338 may be an insulating 2D material, such as hexagonal BN, $CaF_2$, or the like.

In some embodiments, the configuration of the material 338, particular the portion in the opening 320, can be further modified, such that a second conductive portion formed thereafter may have a cross-sectional shape different from the first conductive portion. As such, a cross section of the first conductive portion and a cross section of the second conductive portion may be individually a circular ring shape, an elliptical ring shape, a triangular ring shape, a rectangular ring shape, a square ring shape, an octagonal ring shape, or the like.

Figure 10H:
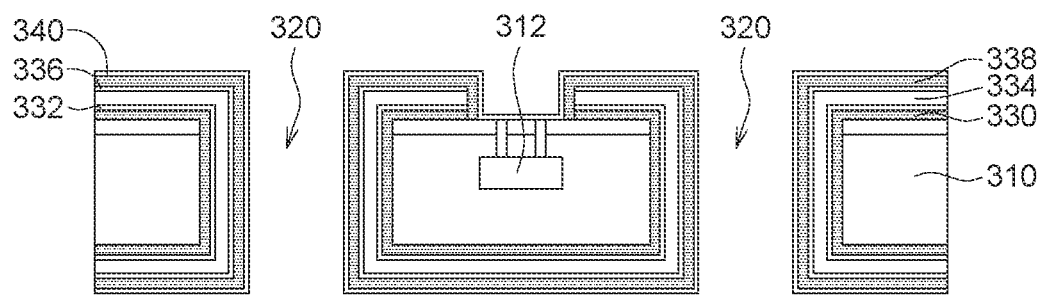

As shown in FIG. 10H, a material 340 for forming a second conductive auxiliary layer is conformally provided on the material 338 for forming the second barrier portion. As such, the material 340 for forming the second conductive auxiliary layer can be conformally provided on the second barrier portion. The material 340 can be provided by a thermal CVD process, a plasma-enhanced CVD process, or any other suitable fabrication process. The material 340 may be a conductive 2D material, such as graphene, a transition metal dichalcogenide like $VSe_2$, $PtTe_2$, $VS_2$, or $PtSe_2$, or the like.

Figure 10I:
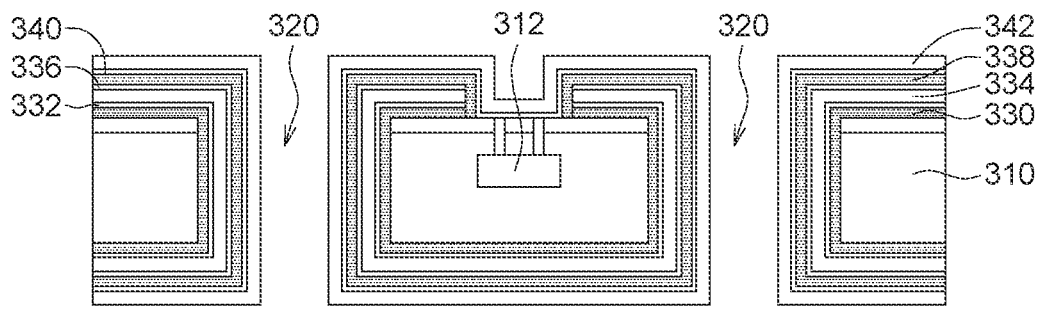

As shown in FIG. 10I, a material 342 for forming a second conductive body is conformally provided on the material 340 for forming the second conductive auxiliary layer. The material 342 can be provided by any suitable deposition process. The material 342 may be Cu, Co, Al, Ru, or the like.

Figure 10J:
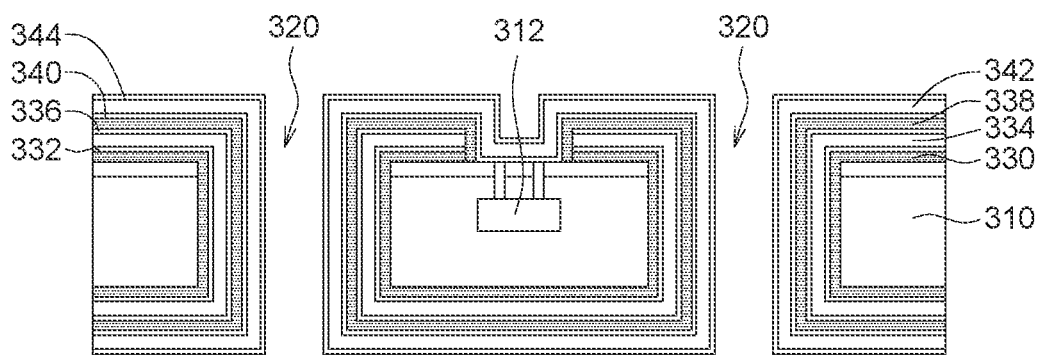

As shown in FIG. 10J, a material 344 for forming another second conductive auxiliary layer is conformally provided on the material 342 for forming the second conductive body. The material 344 can be provided by a thermal CVD process, a plasma-enhanced CVD process, or any other suitable fabrication process. The material 344 may be a conductive 2D material, such as graphene, a transition metal dichalcogenide like $VSe_2$, $PtTe_2$, $VS_2$, or $PtSe_2$, or the like. According to some embodiments, at least one of the material 332 for forming the first conductive auxiliary layer, the material 336 for forming the another first conductive auxiliary layer, the material 340 for forming the second conductive auxiliary layer, or the material 344 for forming the another second conductive auxiliary layer is a conductive 2D material, which may be graphene or a transition metal dichalcogenide.

A second conductive portion of the via structure can thus be formed on the second barrier portion. The second conductive portion is coupled to the electronic device 312, and may be used as a signal-carrying portion.

Figure 10K:
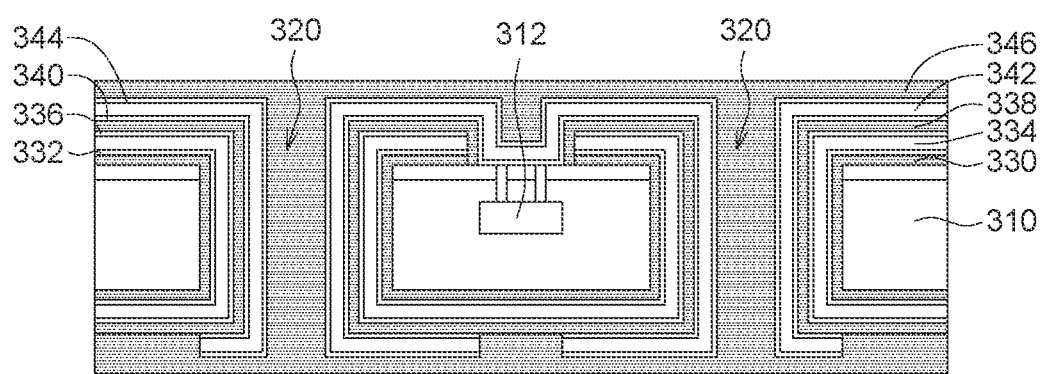

As shown in FIG. 10K, a material 346 for forming a third barrier portion of the via structure is provided and filled into the opening 320. As such, the third barrier portion of the via structure can be formed in a remaining space of the opening 320. The material 346 can be provided by a thermal CVD process, a plasma-enhanced CVD process, or any other suitable fabrication process. The material 346 may be an insulating 2D material, such as hexagonal BN, $CaF_2$, or the like. According to some embodiments, at least one of the first barrier portion, the second barrier portion, or the third barrier portion is formed using an insulating 2D material, which may be hexagonal BN or $CaF_2$.

While the method for manufacturing the semiconductor structure has been illustrated above with accompanying drawings, it is contemplated that the method of the disclosure can be modified to form semiconductor structures of different configurations, such as the semiconductor structures 100A-100G. In addition, the method of the disclosure can be combined with any via manufacturing process. For example, the concept of the disclosure can be applied in a via first process, a via middle process (such as the case of FIGS. 9A-9N), or a via last process (such as the case of FIGS. 10A-10K).

In this disclosure, a semiconductor structure comprising a via structure suitable for the high frequency transmission and a method for manufacturing the same are provided. The via structure comprising an outer first conductive portion and an inner second conductive portion can ensure better signal integrity for high frequency transmission compared to a conventional via structure or a conventional via pair structure. In addition, ring-shaped cross sections can increase the effective conductive area. In some embodiments, the first conductive portion and the second conductive portion are isolated from each other by a second barrier portion formed of an insulating 2D material. Using a low-k barrier portion formed of the insulating 2D material between the outer first conductive portion and the inner second conductive portion will be more beneficial for high frequency transmission compared to the case using a conventional barrier material such as $SiO_2$, $Si_3N_4$, or a polymeric material. In some embodiments, the first conductive portion and the second conductive portion have conductive auxiliary layers. The conductive auxiliary layers formed of a conductive 2D material can reducing inelastic scattering at metal surfaces, and thus the conductivity can be further improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
 a substrate; and
 a via structure through the substrate, the via structure comprising:
 a first conductive portion, the first conductive portion having a ring-shaped cross section;
 a second conductive portion disposed at an inner side of the first conductive portion, the second conductive portion having a ring-shaped cross section;
 a first barrier portion disposed at an outer side of the first conductive portion;
 a second barrier portion disposed between the first conductive portion and the second conductive portion; and
 a third barrier portion disposed at an inner side of the second conductive portion;
 wherein at least one of the first barrier portion, the second barrier portion, or the third barrier portion comprises an insulating 2D material.

2. The semiconductor structure according to claim 1, wherein the second barrier portion comprises the insulating 2D material.

3. The semiconductor structure according to claim 1, wherein the insulating 2D material is hexagonal BN or $CaF_2$.

4. The semiconductor structure according to claim 1, wherein the first conductive portion comprises:
 a first conductive body; and
 two first conductive auxiliary layers disposed at an outer side and an inner side of the first conductive body, respectively; and
 wherein the second conductive portion comprises:
 a second conductive body; and
 two second conductive auxiliary layers disposed at an outer side and an inner side of the second conductive body, respectively.

5. The semiconductor structure according to claim 4, wherein at least one layer of the two first conductive auxiliary layers or the two second conductive auxiliary layers comprises a conductive 2D material.

6. The semiconductor structure according to claim 5, wherein the conductive 2D material is graphene or a transition metal dichalcogenide.

7. The semiconductor structure according to claim 1, wherein the cross section of the first conductive portion and the cross section of the second conductive portion are individually a circular ring shape, an elliptical ring shape, a triangular ring shape, a rectangular ring shape, a square ring shape, or an octagonal ring shape.

8. The semiconductor structure according to claim 1, wherein the second conductive portion is coaxial with the first conductive portion.

9. The semiconductor structure according to claim 1, comprising neighboring two of the via structures, and the second conductive portions of the two via structures are disposed away from each other.

10. The semiconductor structure according to claim 1, wherein the via structure comprises:
 two or more of the second conductive portions separated from each other; and
 two or more of the third barrier portions disposed at the inner sides of the two or more second conductive portions, respectively.

11. The semiconductor structure according to claim 1, wherein the via structure comprises:
 a third conductive portion disposed at the inner side of the second conductive portion, the third conductive portion having a ring-shaped cross section;
 a fourth conductive portion disposed at an inner side of the third conductive portion, the fourth conductive portion having a ring-shaped cross section;
 the third barrier portion disposed between the second conductive portion and the third conductive portion;
 a fourth barrier portion disposed between the third conductive portion and the fourth conductive portion; and
 a fifth barrier portion disposed at an inner side of the fourth conductive portion.

12. A method for manufacturing a semiconductor structure, comprising:
 forming an opening through a substrate;
 forming a first barrier portion of a via structure on a sidewall of the opening;
 forming a first conductive portion of the via structure on the first barrier portion;
 forming a second barrier portion of the via structure on the first conductive portion;
 forming a second conductive portion of the via structure on the second barrier portion; and
 forming a third barrier portion of the via structure in a remaining space of the opening;
 wherein at least one of the first barrier portion, the second barrier portion, or the third barrier portion is formed using an insulating 2D material.

13. The method according to claim 12, wherein the insulating 2D material is hexagonal BN or $CaF_2$.

14. The method according to claim 12,
 wherein forming the first conductive portion comprises:
 conformally providing a material for forming a first conductive auxiliary layer on the first barrier portion;

conformally providing a material for forming a first conductive body on the material for forming the first conductive auxiliary layer; and conformally providing a material for forming another first conductive auxiliary layer on the material for forming the first conductive body; and wherein forming the second conductive portion comprises:

conformally providing a material for forming a second conductive auxiliary layer on the second barrier portion;

conformally providing a material for forming a second conductive body on the material for forming the second conductive auxiliary layer; and conformally providing a material for forming another second conductive auxiliary layer on the material for forming the second conductive body.

15. The method according to claim 14, wherein at least one of the material for forming the first conductive auxiliary layer, the material for forming the another first conductive auxiliary layer, the material for forming the second conductive auxiliary layer, or the material for forming the another second conductive auxiliary layer is a conductive 2D material.

16. The method according to claim 15, wherein the conductive 2D material is graphene or a transition metal dichalcogenide.

17. The method according to claim 12, wherein after forming the third barrier portion, the method further comprises:

conducting a backside grinding process to expose the opening from a backside of the substrate;

forming a first backside barrier portion on a lower surface of the substrate;

forming a backside conductive portion on the first backside barrier portion; and forming a second backside barrier portion on the backside conductive portion.

18. The method according to claim 12, wherein before forming the first barrier portion, the method further comprising:

conducting a backside grinding process to expose the opening from a backside of the substrate.

19. The method according to claim 12, further comprising:

forming an electronic device in the substrate;

wherein the first conductive portion is not coupled to the electronic device, and the second conductive portion is coupled to the electronic device.

20. The method according to claim 12, wherein a cross section of the first conductive portion and a cross section of the second conductive portion are individually a circular ring shape, an elliptical ring shape, a triangular ring shape, a rectangular ring shape, a square ring shape, or an octagonal ring shape.

* * * * *